United States Patent
Li

(10) Patent No.: US 8,533,575 B2
(45) Date of Patent: Sep. 10, 2013

(54) WIRELESS COMMUNICATION APPARATUS

(75) Inventor: Jifeng Li, Kanagawa (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 13/147,729

(22) PCT Filed: Dec. 10, 2009

(86) PCT No.: PCT/JP2009/006772
§ 371 (c)(1),
(2), (4) Date: Aug. 3, 2011

(87) PCT Pub. No.: WO2010/089835
PCT Pub. Date: Aug. 12, 2010

(65) Prior Publication Data
US 2011/0296283 A1    Dec. 1, 2011

(30) Foreign Application Priority Data

Feb. 5, 2009    (JP) ................................. 2009-025120

(51) Int. Cl.
*H03M 13/03*    (2006.01)
(52) U.S. Cl.
USPC .......................................... 714/790; 714/786
(58) Field of Classification Search
USPC .................. 714/790, 781, 752, 786, 701, 747
See application file for complete search history.

(56) References Cited

U.S. PATENT DOCUMENTS

| | | | |
|---|---|---|---|
| 6,553,540 B1 | 4/2003 | Schramm | |
| 6,681,365 B1 | 1/2004 | Anand | |
| 6,903,665 B2 * | 6/2005 | Akhter et al. | 341/50 |
| 6,928,927 B2 * | 8/2005 | Endo | 101/153 |
| 7,289,574 B2 * | 10/2007 | Parolari | 375/295 |
| 7,346,835 B1 | 3/2008 | Lobinger | |
| 2003/0043928 A1 | 3/2003 | Ling | |

FOREIGN PATENT DOCUMENTS

| | | |
|---|---|---|
| JP | 2001/203588 | 7/2001 |
| JP | 2002/171298 | 6/2002 |
| JP | 2002/532955 | 10/2002 |
| JP | 2004/260713 | 9/2004 |
| JP | 2004/535694 | 11/2004 |
| WO | 2009/008182 | 1/2009 |

OTHER PUBLICATIONS

International Search Report dated Mar. 9, 2010.
3GPP TS 36.211 V8.0.0, "3rd Generation Partnership Project; Technical Specification Group Radio Access Network; Evolved Universal Terrestrial Radio Access (E-UTRA); Physical channels and modulation (Release 8)," Sep. 2007, pp. 1-50, p. 3, Line 1.
C. Berrou, et al., "Near Optimum Error Correcting Coding and Decoding: Turbo-Codes," IEEE Transactions on Communications, vol. 44, No. 10, Oct. 1996, pp. 1261-1271, p. 3, Line 3.

\* cited by examiner

*Primary Examiner* — Fritz Alphonse
(74) *Attorney, Agent, or Firm* — Dickinson Wright PLLC

(57) ABSTRACT

An encoding processing apparatus in which reception precision characteristics are improved by specially adapting puncture processing in respect of the code words for each encoding system. A puncture section switches between a puncture pattern for a first code word partial sequence obtained on the basis of the head and tail in a fixed information block, and a puncture pattern for a second code word partial sequence obtained on the basis of the middle portion, excluding the head and tail. Also, the puncture section receives the number of retransmissions of information from a retransmission control section and switches the puncture pattern for the second code word partial sequence in accordance with the number of retransmissions. In addition, the puncture section prioritizing systematic bits over parity bits when puncturing the first code word partial sequence.

5 Claims, 8 Drawing Sheets

| $i$ | $K_i$ | $f_1$ | $f_2$ | $i$ | $K_i$ | $f_1$ | $f_2$ | $i$ | $K_i$ | $f_1$ | $f_2$ | $i$ | $K_i$ | $f_1$ | $f_2$ |
|---|---|---|---|---|---|---|---|---|---|---|---|---|---|---|---|
| 1 | 40 | 3 | 10 | 48 | 416 | 25 | 52 | 95 | 1120 | 67 | 140 | 142 | 3200 | 111 | 240 |
| 2 | 48 | 7 | 12 | 49 | 424 | 51 | 106 | 96 | 1152 | 35 | 72 | 143 | 3264 | 443 | 204 |
| 3 | 56 | 19 | 42 | 50 | 432 | 47 | 72 | 97 | 1184 | 19 | 74 | 144 | 3328 | 51 | 104 |
| 4 | 64 | 7 | 16 | 51 | 440 | 91 | 110 | 98 | 1216 | 39 | 76 | 145 | 3392 | 51 | 212 |
| 5 | 72 | 7 | 18 | 52 | 448 | 29 | 168 | 99 | 1248 | 19 | 78 | 146 | 3456 | 451 | 192 |
| 6 | 80 | 11 | 20 | 53 | 456 | 29 | 114 | 100 | 1280 | 199 | 240 | 147 | 3520 | 257 | 220 |
| 7 | 88 | 5 | 22 | 54 | 464 | 247 | 58 | 101 | 1312 | 21 | 82 | 148 | 3584 | 57 | 336 |
| 8 | 96 | 11 | 24 | 55 | 472 | 29 | 118 | 102 | 1344 | 211 | 252 | 149 | 3648 | 313 | 228 |
| 9 | 104 | 7 | 26 | 56 | 480 | 89 | 180 | 103 | 1376 | 21 | 86 | 150 | 3712 | 271 | 232 |
| 10 | 112 | 41 | 84 | 57 | 488 | 91 | 122 | 104 | 1408 | 43 | 88 | 151 | 3776 | 179 | 236 |
| 11 | 120 | 103 | 90 | 58 | 496 | 157 | 62 | 105 | 1440 | 149 | 60 | 152 | 3840 | 331 | 120 |
| 12 | 128 | 15 | 32 | 59 | 504 | 55 | 84 | 106 | 1472 | 45 | 92 | 153 | 3904 | 363 | 244 |
| 13 | 136 | 9 | 34 | 60 | 512 | 31 | 64 | 107 | 1504 | 49 | 846 | 154 | 3968 | 375 | 248 |
| 14 | 144 | 17 | 108 | 61 | 520 | 17 | 66 | 108 | 1536 | 71 | 48 | 155 | 4032 | 127 | 168 |
| 15 | 152 | 9 | 38 | 62 | 544 | 35 | 68 | 109 | 1568 | 13 | 28 | 156 | 4096 | 31 | 64 |
| 16 | 160 | 21 | 120 | 63 | 560 | 227 | 420 | 110 | 1600 | 17 | 80 | 157 | 4160 | 33 | 130 |
| 17 | 168 | 101 | 84 | 64 | 576 | 65 | 96 | 111 | 1632 | 25 | 102 | 158 | 4224 | 43 | 264 |
| 18 | 176 | 21 | 44 | 65 | 592 | 19 | 74 | 112 | 1664 | 183 | 104 | 159 | 4288 | 33 | 134 |
| 19 | 184 | 57 | 46 | 66 | 608 | 37 | 76 | 113 | 1696 | 55 | 954 | 160 | 4352 | 477 | 408 |
| 20 | 192 | 23 | 48 | 67 | 624 | 41 | 234 | 114 | 1728 | 127 | 96 | 161 | 4416 | 35 | 138 |
| 21 | 200 | 13 | 50 | 68 | 640 | 39 | 80 | 115 | 1760 | 27 | 110 | 162 | 4480 | 233 | 200 |
| 22 | 208 | 27 | 52 | 69 | 656 | 185 | 82 | 116 | 1792 | 29 | 112 | 163 | 4544 | 357 | 142 |
| 23 | 216 | 11 | 36 | 70 | 672 | 43 | 252 | 117 | 1824 | 29 | 114 | 164 | 4608 | 337 | 460 |
| 24 | 224 | 27 | 56 | 71 | 688 | 21 | 86 | 118 | 1856 | 57 | 116 | 165 | 4672 | 37 | 146 |
| 25 | 232 | 85 | 58 | 72 | 704 | 155 | 44 | 119 | 1888 | 45 | 354 | 166 | 4736 | 71 | 444 |
| 26 | 240 | 29 | 60 | 73 | 720 | 79 | 120 | 120 | 1920 | 31 | 120 | 167 | 4800 | 71 | 120 |
| 27 | 248 | 33 | 62 | 74 | 736 | 139 | 92 | 121 | 1952 | 59 | 610 | 168 | 4864 | 37 | 152 |
| 28 | 256 | 15 | 32 | 75 | 752 | 23 | 94 | 122 | 1984 | 185 | 124 | 169 | 4928 | 39 | 462 |
| 29 | 264 | 17 | 198 | 76 | 768 | 217 | 48 | 123 | 2016 | 113 | 420 | 170 | 4992 | 127 | 234 |
| 30 | 272 | 33 | 68 | 77 | 784 | 25 | 98 | 124 | 2048 | 31 | 64 | 171 | 5056 | 39 | 158 |
| 31 | 280 | 103 | 210 | 78 | 800 | 17 | 80 | 125 | 2112 | 17 | 66 | 172 | 5120 | 39 | 80 |
| 32 | 288 | 19 | 36 | 79 | 816 | 127 | 102 | 126 | 2176 | 171 | 136 | 173 | 5184 | 31 | 96 |
| 33 | 296 | 19 | 74 | 80 | 832 | 25 | 52 | 127 | 2240 | 209 | 420 | 174 | 5248 | 113 | 902 |
| 34 | 304 | 37 | 76 | 81 | 848 | 239 | 106 | 128 | 2304 | 253 | 216 | 175 | 5312 | 41 | 166 |
| 35 | 312 | 19 | 78 | 82 | 864 | 17 | 48 | 129 | 2368 | 367 | 444 | 176 | 5376 | 251 | 336 |
| 36 | 320 | 21 | 120 | 83 | 880 | 137 | 110 | 130 | 2432 | 265 | 456 | 177 | 5440 | 43 | 170 |
| 37 | 328 | 21 | 82 | 84 | 896 | 215 | 112 | 131 | 2496 | 181 | 468 | 178 | 5504 | 21 | 86 |
| 38 | 336 | 115 | 84 | 85 | 912 | 29 | 114 | 132 | 2560 | 39 | 80 | 179 | 5568 | 43 | 174 |
| 39 | 344 | 193 | 86 | 86 | 928 | 15 | 58 | 133 | 2624 | 27 | 164 | 180 | 5632 | 45 | 176 |
| 40 | 352 | 21 | 44 | 87 | 944 | 147 | 118 | 134 | 2688 | 127 | 504 | 181 | 5696 | 45 | 178 |
| 41 | 360 | 133 | 90 | 88 | 960 | 29 | 60 | 135 | 2752 | 143 | 172 | 182 | 5760 | 151 | 120 |
| 42 | 368 | 81 | 46 | 89 | 976 | 59 | 122 | 136 | 2816 | 43 | 88 | 183 | 5824 | 69 | 182 |
| 43 | 376 | 45 | 94 | 90 | 992 | 65 | 124 | 137 | 2880 | 29 | 300 | 184 | 5888 | 323 | 184 |
| 44 | 384 | 23 | 48 | 91 | 1008 | 55 | 84 | 138 | 2944 | 45 | 92 | 185 | 5952 | 47 | 186 |
| 45 | 392 | 243 | 98 | 92 | 1024 | 31 | 64 | 139 | 3008 | 157 | 188 | 186 | 6016 | 23 | 94 |
| 46 | 400 | 151 | 40 | 93 | 1056 | 17 | 66 | 140 | 3072 | 47 | 96 | 187 | 6080 | 47 | 190 |
| 47 | 408 | 155 | 102 | 94 | 1088 | 171 | 204 | 141 | 3136 | 13 | 28 | 188 | 6144 | 283 | 480 |

FIG.3

| RV | R | 1/2 | 3/4 | 5/6 |
|---|---|---|---|---|
| 1 | $R_1$ | 11<br>10<br>01 | 110111<br>100100<br>000100 | 111101111<br>100001000<br>000000100000 |
| 2 | $R_2$ | 10<br>11<br>10 | 000000<br>011110<br>110011 | 000000000000<br>001111110<br>110100011 |
| | $R_1+R_2$ | 1/3 | 3/8 | 5/12 |

FIG.7

WIRELESS COMMUNICATION APPARATUS

TECHNICAL FIELD

The present invention relates to a radio communication apparatus.

BACKGROUND ART

In mobile communication which has become widespread toady, communication with high accuracy is required in various channel environments. Further, as a means to realize communication with high accuracy even in severe channel environments, error correction encoding processing is performed on transmission data.

In 3GPP (see Non-Patent Literature 1), a plurality of fixed information blocks formed with a predetermined number of bits K are formed from a series of transmission sequences, and error correction encoding processing is performed per this fixed information block. There is no problem when that series of transmission data sequences can be divided by K. In contrast to this, when that series of transmission data sequences cannot be divided by K, bit padding is performed on that series of transmission data sequences to arrange padding bits in the head part of that series of transmission data sequences, so that the total number of bits is made a number that can be divided by K. Then, encoding processing is performed on the data sequences in which padding bits are arranged, per fixed information block. By this means, it is possible to perform encoding processing of constraint length K uniformly.

Further, error correction encoding schemes include convolutional encoding scheme (for example, see Patent Literature 1) and turbo encoding scheme (for example, see Non-Patent Literature 2).

Then, afterwards, modulation processing is performed in modulation section on codewords obtained by error correction encoding processing, and before the modulation processing, puncturing (i.e. decimation) is performed to perform rate matching. In 3GPP, there are stipulations about a turbo encoder and a rate matching apparatus for performing puncturing. Further, there is a stipulation that when performing rate matching after performing puncturing processing, information bits (i.e. systematic bits) are not deleted, but only parity bits are deleted out of turbo-encoded data sequences.

CITATION LIST

Patent Literature

PTL 1
Japanese Patent Application Laid-Open No. 2001-203588

Non-Patent Literature

NPL 1
3GPP TS36.211V800
NPL 2
Claude Berrou, "Near Optimum Error Correcting Coding And Decoding: Turbo-Codes," IEEE Trans. On Communications, Vol. 44, No. 10, October 1996.

SUMMARY OF INVENTION

Technical Problem

By the way, generally, it is known that reception accuracy characteristics at a receiving side varies depending on encoding processing at a transmitting side.

However, in the above-described encoding processing, no consideration has been made for the reception accuracy characteristics at a receiving side. Further, in the above-described conventional puncturing processing that is performed on codewords, no consideration has been made for characteristics of convolutional encoding and turbo encoding and reception accuracy characteristics.

It is therefore an object of the present invention to provide a communication apparatus for improving reception accuracy characteristics by devising puncturing processing on codewords for each encoding scheme.

Solution to Problem

A radio communication apparatus according to the present invention employs a configuration to transmit an encoded codeword sequence, comprising: an encoding section that contain a convolutional encoder that performs convolutional encoding on a fixed information block formed with K bits; and a puncturing section that punctures the codeword sequence obtained by encoding processing in the encoding section based on a puncturing pattern, switching puncturing patterns for a first codeword subsequence that is obtained based on a head part and a tail part of the fixed information block and a second codeword subsequence that is obtained based on a center part, not including the head part and the tail part.

Advantageous Effects of Invention

According to the present invention, it is possible to provide an encoding processing apparatus for improving reception accuracy characteristics by devising puncturing processing on codewords for each encoding scheme.

BRIEF DESCRIPTION OF DRAWINGS

FIG. 3 shows a table indicating interleaver parameters used in the interleaver shown in FIG. 2;

FIG. 7 shows puncturing patterns corresponding to encoding rates; and

DESCRIPTION OF EMBODIMENTS

Figure 1:
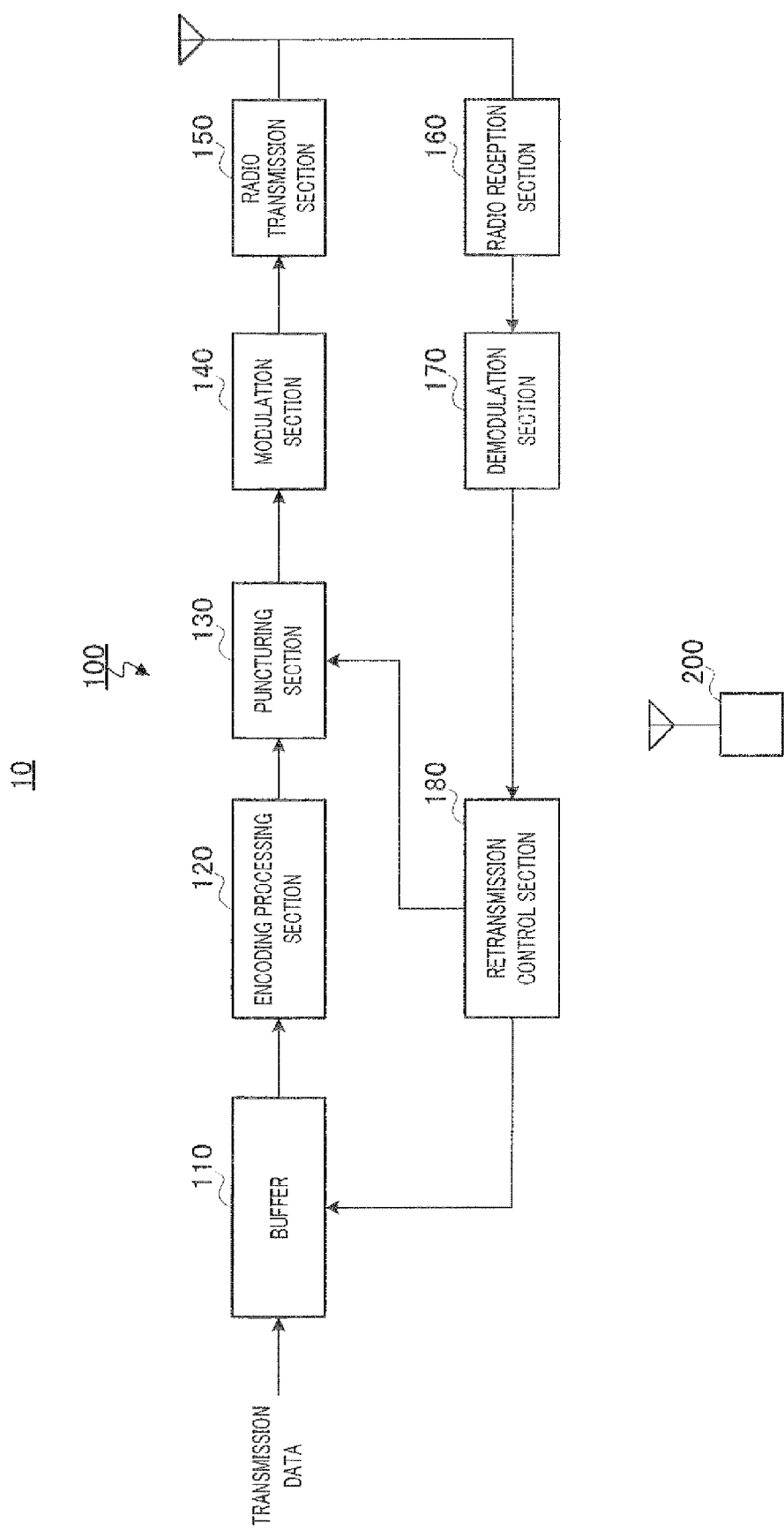
FIG. 1 is a block diagram showing a configuration of a radio communication system according to Embodiment 1 of the present invention.

Now, embodiments of the present invention will be described in detail with reference to the accompanying drawings. In embodiments, the same parts will be assigned the same reference numerals and overlapping explanations will be omitted.

Embodiment 1

As shown in FIG. 1, radio communication system 10 is provided with radio communication apparatus 100 and radio communication apparatus 200.

In FIG. 1, radio communication apparatus 100 is provided with buffer 110, encoding processing section 120, puncturing section 130, modulation section 140, radio transmission section 150, radio reception section 160, demodulation section 170, and retransmission control section 180.

Buffer 110 maintains transmission data of the initial transmission and outputs the transmission data to encoding processing section 120. Further, buffer 110 outputs the maintained data corresponding to a retransmission control signal to encoding processing section 120, based on the retransmission control signal from retransmission control section 180.

Encoding processing section 120 contains a convolutional encoder. This convolutional encoder receives as input a fixed information block formed with K bits, and performs convolutional encoding processing per fixed information block. The convolutional encoder performs convolutional encoding processing at code constraint length V. Code constraint length V is the number adding one to the number of shift registers that are provided in the convolutional encoder.

Figure 2:
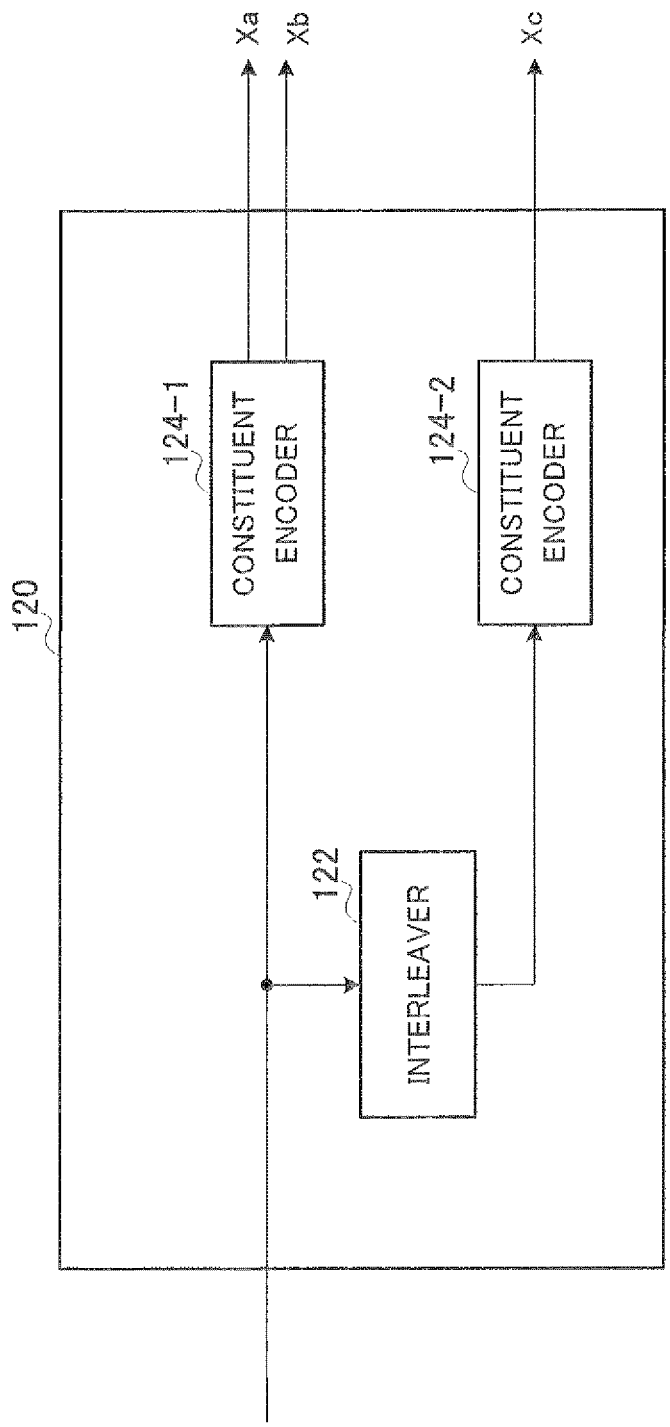
FIG. 2 is a block diagram showing a configuration of an encoding processing section in FIG. 1.

Specifically, encoding processing section 120 is provided with interleaver 122 and constituent encoders 124-1, 2, as shown in FIG. 2. Then, the above-described convolutional encoder is provided in each of constituent encoders 124-1, 2.

Interleaver 122 receives as input a fixed information block and performs interleaving processing on this fixed information block using a predetermined interleaving pattern.

This interleaving processing is represented by the following equation:

$$c'_i = c_{\Pi(i)}$$

where a bit sequence of the fixed information block is expressed by $c_0, c_1, \ldots c_{K-1}$ and an interleaved bit sequence is expressed by $c'_0, c'_1, \ldots, c'_{K-1}$. Further, $i=0, 1, \ldots$ and $(K-1)$ and $\Pi(i) = (f_1 \cdot i + f_2 \cdot i^2) \mod K$ are satisfied, and $f_1$ and $f_2$ are natural numbers depending on K.

For example, it is possible to use the table of FIG. 3 for interleaver parameters for i, Ki, f1, and f2.

Constituent encoders 124-1, 2 perform convolutional encoding processing on input data sequences. Constituent encoder 124-1 performs convolutional encoding processing on the fixed information block itself. Constituent encoder 124-2 performs convolutional encoding processing on the fixed information block interleaved in interleaver 122.

The codeword sequence thus obtained by error correction encoding processing in encoding processing section 120 is output to puncturing section 130.

Puncturing section 130 punctures a codeword sequence received from encoding processing section 120. Puncturing section 130 switches the puncturing patterns for the first codeword subsequence that is obtained based on the head part and the tail part of the fixed information block, and the second codeword subsequence that is obtained based on the center part, not including the head part and the tail part. Further, puncturing section 130 receives information about the number of retransmissions from retransmission control section 180, and switches the puncturing pattern for the second codeword subsequence based on the number of retransmissions. Further, puncturing section 130 punctures a systematic bit with priority over a parity bit in the first codeword subsequence.

Modulation section 140 performs modulation processing on the transmission data punctured in puncturing section 130, and outputs the obtained modulated signal to radio transmission section 150.

Radio transmission section 150 performs a predetermined radio transmission processing, such as D/A conversion and up-conversion, on the modulated signal, and transmits the obtained radio signal to radio communication apparatus 200 via an antenna.

Radio reception section 160 receives the signal transmitted from radio communication apparatus 200 via an antenna. Radio reception section 160 performs a predetermined reception radio processing, such as down conversion and A/D conversion, on a radio received signal, and outputs the obtained signal to demodulation section 170.

Demodulation section 170 demodulates the signal received from radio reception section 160.

Retransmission control section 180 extracts information about whether or not reception succeeded (i.e. ACK/NACK information) from the signal demodulated in demodulation section 170. This information about whether or not reception succeeded is information that is fed back based on a result of determination that is made by radio communication apparatus 200 by determining whether or not reception of the received signal transmitted from radio communication apparatus 100 succeeded.

Upon receiving NACK information, retransmission control section 180 outputs retransmission control information to buffer 110 and outputs information about the number of transmissions to puncturing section 130 to order retransmission of transmission data corresponding to this NACK information.

An operation of radio communication apparatus 100 having the above configuration will be described below.

Transmission data output from buffer 110 is encoded in encoding processing section 120. The codeword sequence obtained by this encoding processing is punctured in puncturing section 130. Here, puncturing section 130 switches puncturing patterns according to "the part in a codeword sequence."

Figure 4:
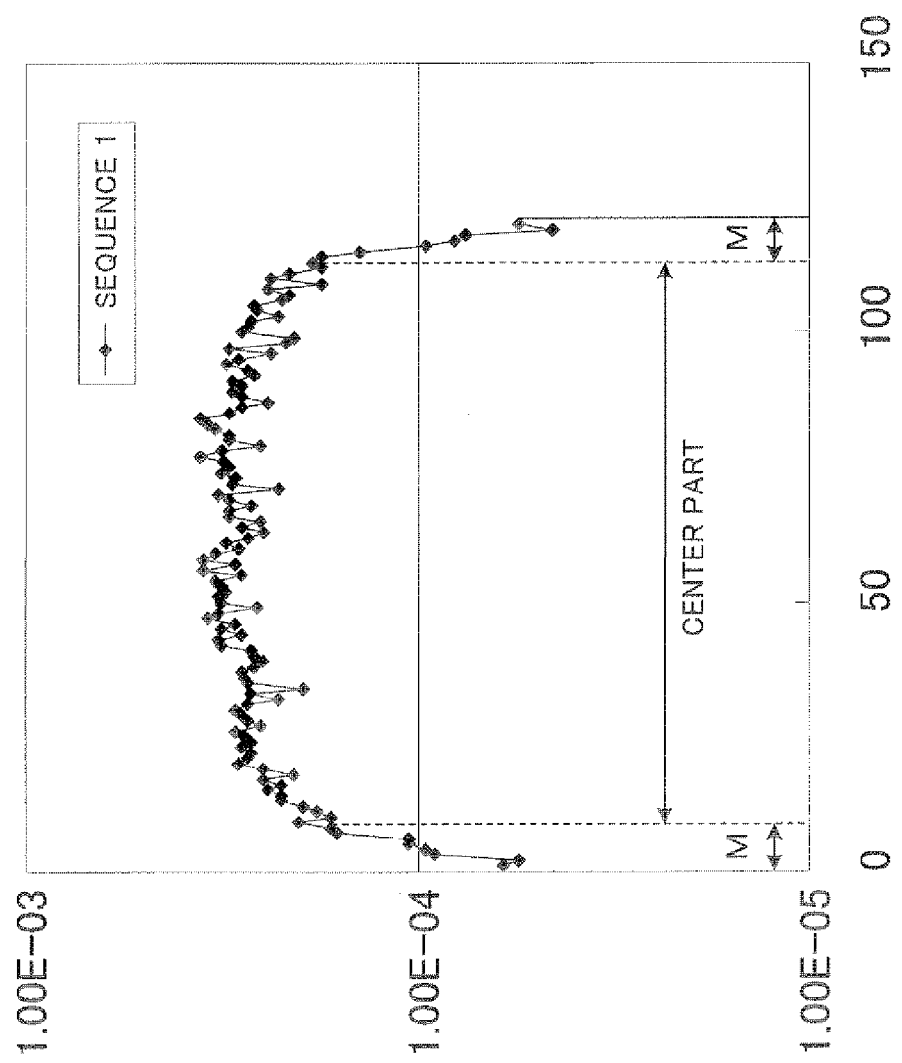
FIG. 4 shows error characteristics per bit position in a fixed information block with code constraint length K (convolutional encoding scheme)

Here, error characteristics per bit position in a fixed information block formed with K bits when convolutional encoding is employed is shown in FIG. 4. In FIG. 4, the horizontal axis indicates a bit position and the vertical axis indicates a bit error rate (BER).

As shown in FIG. 4, the BER of the bit position group in the center part of the fixed information block, not including the head part and the tail part, is poor. On the other hand, the BER in the head part and the tail part, each formed with M bits, is better than the BER in the center part. Here, M bits are proportional to code constraint length V.

Figure 5:
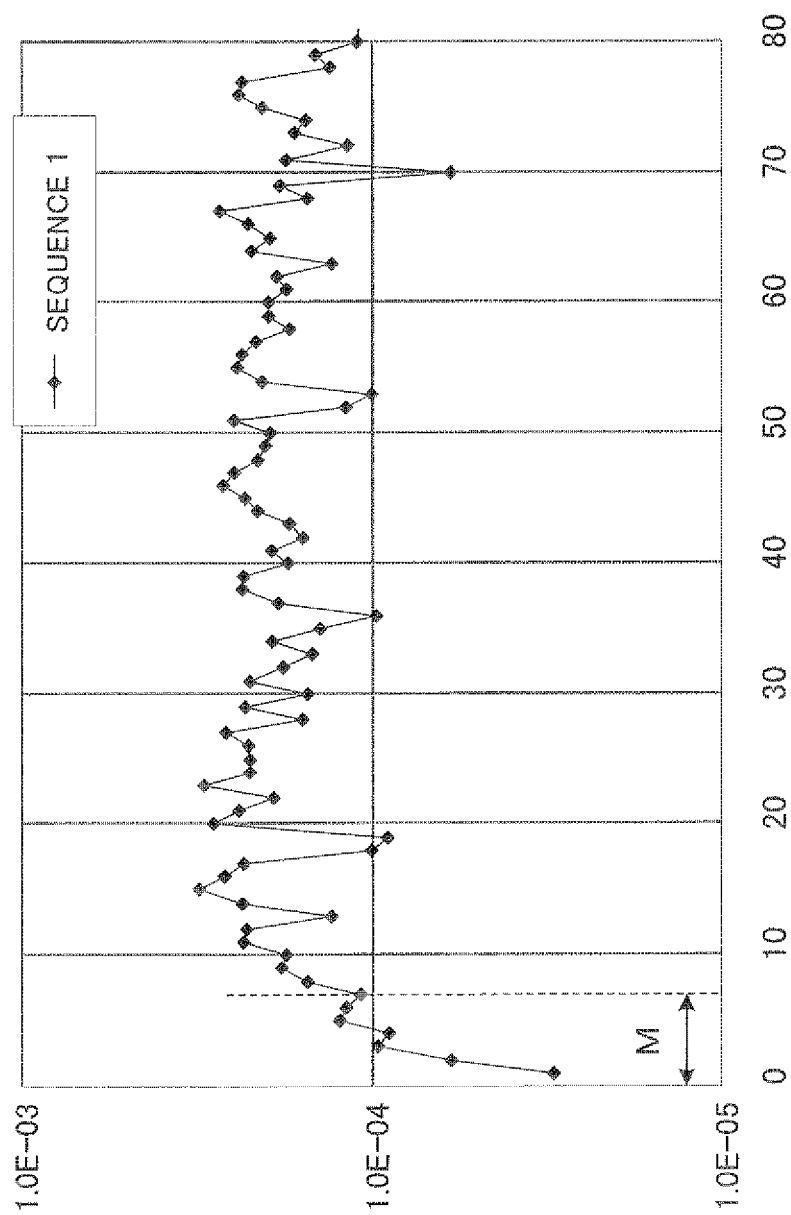
FIG. 5 shows error characteristics per bit position in a fixed information block with code constraint length K (turbo encoding scheme)

Further, FIG. 5 shows error characteristics per bit position in a fixed information block formed with K bits when turbo encoding scheme is employed. In FIG. 5, the horizontal axis indicates a bit position and the vertical axis indicates a bit error rate (BER).

As shown in FIG. 5, the BER of the bit position group formed with M bits in the head part of the fixed information block is good. Here, M bits are proportional to code constraint length V.

On the other hand, although the BER in parts other than the above head part is poorer than the BER in the head part, the BER in certain bit positions is high. Here, the certain bit positions showing higher BER correspond to the bit positions that are positioned within M bits in the head part of the fixed information block that is interleaved in interleaver 122.

That is, in the fixed information block immediately before being input into the convolutional encoder, the head part and the tail part, each formed with M bits, tend to show better BER than the BER in the center part. That is, the difference of BER characteristics arises between the first codeword subsequence that is obtained based on the head part and the tail part and the second codeword subsequence that is obtained based on the center part, not including the head part and the tail part of the fixed information block. This is caused because tail bits are added to the tail of a fixed information block, so that all shift register values provided in the convolutional encoder are returned to 0.

Therefore, puncturing section 130 switches the puncturing patterns for the first codeword subsequence that is obtained based on the head part and the tail part of the fixed information block and the second codeword subsequence that is obtained based on the center part, not including the head part and the tail part. By this means, it is possible to perform puncturing taking into account the difference of reception accuracy characteristics corresponding to the part of the codeword sequence.

Figure 6:
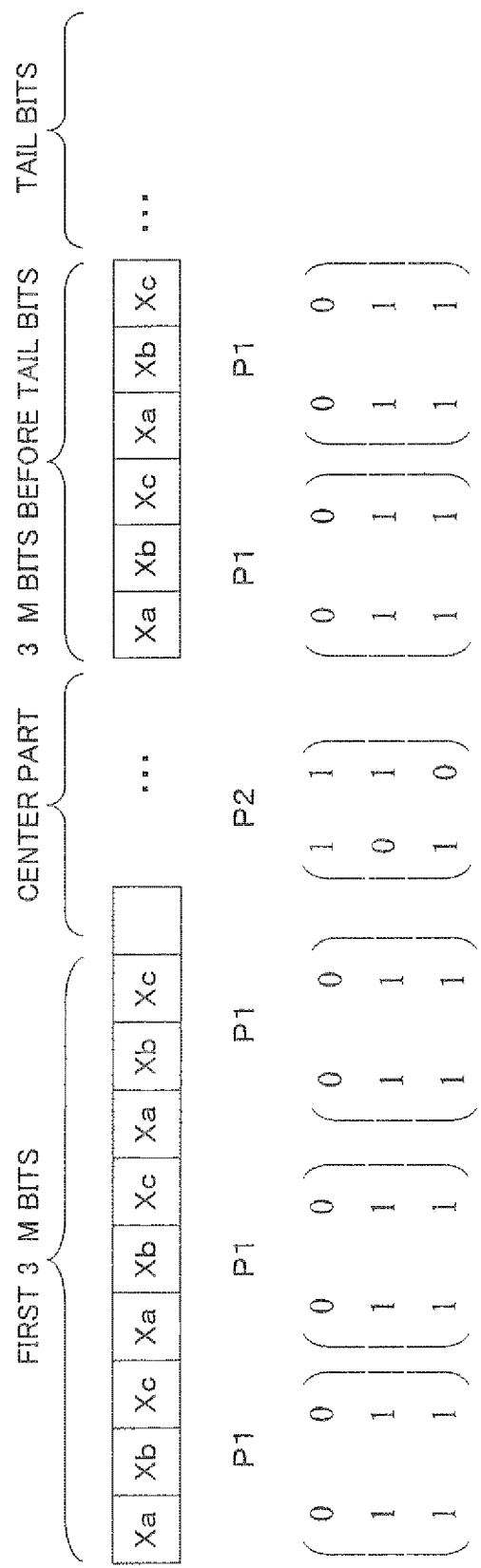
FIG. 6 shows switching of puncturing patterns.

FIG. 6 shows switching of puncturing patterns. FIG. 6 shows, in particular, a case where the coding rate is ⅓. Further, Xa in FIG. 6 indicates a systematic bit, Xb and Xc indicate a parity bit, and Xa, Xb, and Xc correspond to the reference numerals in FIG. 2.

In FIG. 6, puncturing pattern P1 is applied to the first codeword subsequence (the first 3×M bits and 3×M bits before tail bits in FIG. 6) that is obtained based on the head part and the tail part of the fixed information block. Puncturing pattern P1 is a pattern in which systematic bit Xa is punctured. In this regard, in the matrix showing puncturing patterns, element 0 indicates that puncturing is performed and element 1 indicates that puncturing is not performed. Further, the first row corresponds to systematic bit Xa and the second row and the third row correspond to parity bits Xb and Xc, respectively.

On the other hand, puncturing pattern P2 is applied to the second codeword subsequence obtained based on the center part, not including the head part and the tail part. Puncturing pattern P2 punctures parity bits without puncturing systematic bits.

That is, puncturing section 130 punctures a systematic bit with priority over a parity bit in the first codeword subsequence, which shows better reception characteristics.

Further, upon retransmission, puncturing section 130 switches puncturing patterns from the puncturing pattern of the second codeword subsequence, which shows relatively poorer reception characteristics, to a pattern that is different from the pattern in previous transmission. That is, puncturing section 130 switches the puncturing pattern for the second codeword subsequence based on the number of retransmissions. FIG. 7 shows puncturing patterns corresponding to redundancy versions (RVs) 1 and 2 at a coding rate of ⅓, ⅜, and 5/12, respectively. Puncturing section 130 switches, for example, the puncturing pattern of RV 1 and the puncturing pattern of RV 2 that match the set coding rate, according to the number of retransmissions.

As described above, according to the present invention, it is possible to perform puncturing taking into account the difference of reception accuracy characteristics corresponding to the part of a codeword sequence, so that reception accuracy characteristics can be improved at a receiving side.

Embodiment 2

A case will be described with Embodiment 2 where a convolutional code is used instead of a turbo code.

Figure 8:
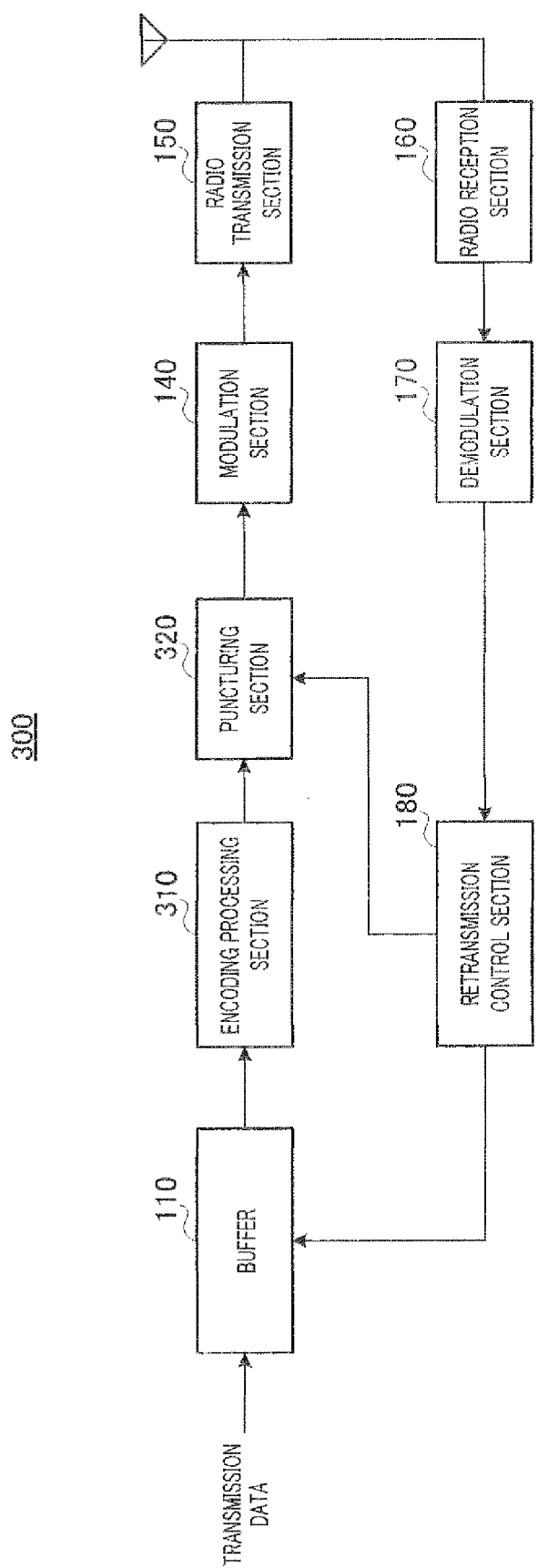
FIG. 8 is a block diagram showing a configuration of a radio communication apparatus according to Embodiment 2 of the present invention.

FIG. 8 is a block diagram showing a configuration of radio communication apparatus 300 according to Embodiment 2 of the present invention. In FIG. 8, radio communication apparatus 300 is provided with encoding processing section 310 and puncturing section 320. Encoding processing section 310 contains a convolutional encoder. This convolutional encoder receives as input a fixed information block formed with K bits, and performs convolutional encoding processing per fixed information block. The convolutional encoder performs convolutional encoding processing at code constraint length V. Code constraint length V is expressed as the number in which one is added to the number of shift registers that are provided in the convolutional encoder. Here, encoding processing section 310 is not provided with an interleaver, unlike encoding processing section 120 that performs turbo encoding.

Therefore, error characteristics per bit position in the fixed information block formed with K bits, which is obtained in encoding processing section 310, is the same shown in FIG. 4.

Thus, puncturing section 320 switches puncturing patterns for the first codeword subsequence that is obtained based on the head part and the tail part of the fixed information block and the second codeword subsequence that is obtained based on the center part, not including the head part and the tail part. Here, puncturing section 320 increases the number of bits to puncture in the first codeword subsequence than the second codeword subsequence.

Further, puncturing section 320 receives information about the number of retransmissions from retransmission control section 180, and switches the puncturing pattern for the second codeword subsequence based on the number of retransmissions.

As described above, according to the present embodiment, it is possible to perform puncturing taking into account the difference of reception accuracy characteristics corresponding to the part of a codeword sequence, so that reception accuracy characteristics can be improved at a receiving side.

Other Embodiments

Cases have been described with Embodiment 1 and Embodiment 2 where puncturing patterns for puncturing a second codeword subsequence based on the number of retransmissions. If taking into account characteristics of convolutional encoding or turbo encoding and reception accuracy characteristics, it is possible to perform the following retransmission control. That is, in retransmission, before encoding, it is possible to perform transmission after encoding only the bits other than the head part and the tail part (i.e. the center part, not including the head part and the tail part) in a fixed information block. In this regard, in the first transmission, it is possible to perform the same processing as in Embodiment 1 and Embodiment 2.

The disclosure of Japanese Patent Application No. 2009-025120, filed on Feb. 5, 2009, including the specification, drawings and abstract, is incorporated herein by reference in its entirety.

INDUSTRIAL APPLICABILITY

The radio communication apparatus according to the present invention is useful for improving reception accuracy characteristics by devising puncturing processing on codewords for each encoding scheme.

The invention claimed is:

1. A radio communication apparatus to transmit an encoded codeword sequence, comprising:
an encoding section that encodes a fixed information block formed with K bits; and
a puncturing section that punctures the codeword sequence obtained by encoding processing in the encoding section based on a puncturing pattern, puncturing a systematic bit with priority over a parity bit in a first codeword subsequence that is obtained based on a head part and a tail part of the fixed information block, and performing puncturing in a second codeword subsequence that is obtained based on a center part, not including the head part and the tail part, using a puncturing pattern that is different from the pattern of the first codeword subsequence.

2. The radio communication apparatus according to claim 1, wherein the puncturing section punctures the parity bit without puncturing the systematic bit, in the second codeword subsequence.

3. The radio communication apparatus according to claim 1, further comprising a retransmission control section that controls retransmission processing based on whether or not reception succeeded with respect to the transmitted codeword sequence at a receiving side, wherein the puncturing section switches the puncturing pattern for the second codeword subsequence based on the number of retransmissions.

4. The radio communication apparatus according to claim 1, wherein the puncturing section increases the number of bits to puncture in the first codeword subsequence greater than the second codeword subsequence.

5. The radio communication apparatus according to claim 1, wherein:
the encoding section performs convolutional encoding processing on the fixed information block; and
the number of bits M that form each of the head part and the tail part is proportional to code constraint length V for convolutional encoding.

* * * * *